United States Patent [19]

Lucas et al.

[11] Patent Number: 4,593,250

[45] Date of Patent: Jun. 3, 1986

[54] OPERATIONAL AMPLIFIER COMPENSATION TECHNIQUE FOR BIQUADRATIC NOTCH ACTIVE FILTERS

[75] Inventors: Charles H. Lucas, Newport Beach; James H. Mulligan, Jr., Santa Ana, both of Calif.

[73] Assignee: Hughes Aircraft Company, El Segundo, Calif.

[21] Appl. No.: 769,291

[22] Filed: Aug. 26, 1985

[51] Int. Cl.⁴ ............................................. H03F 1/32
[52] U.S. Cl. ............................... 330/107; 330/151; 330/302
[58] Field of Search ............... 330/107, 109, 151, 294, 330/302

[56] References Cited

U.S. PATENT DOCUMENTS 3,868,605  2/1975  Poole ..................................... 333/76
4,080,559  3/1978  Wright et al. ......................... 322/58
4,242,642  12/1980  Laker et al. ......................... 330/109
4,257,006  3/1981  Schaumann .......................... 330/107
4,315,227  2/1982  Fleischer et al. .................... 333/173

Primary Examiner—James B. Mullins
Assistant Examiner—G. Wan
Attorney, Agent, or Firm—A. W. Karambelas

[57] ABSTRACT

An active biquadratic notch filter having first integrating circuitry for providing a first integration signal and further having second integrating circuitry responsive to the first integration signal for providing a filter output. The first integrating circuitry includes at least one operational amplifier. The notch filter further includes compensation circuitry for compensating the limitation on notch frequency attenuation resulting from current lag introduced by the at least one operational amplifier of the first integrating circuitry.

12 Claims, 3 Drawing Figures

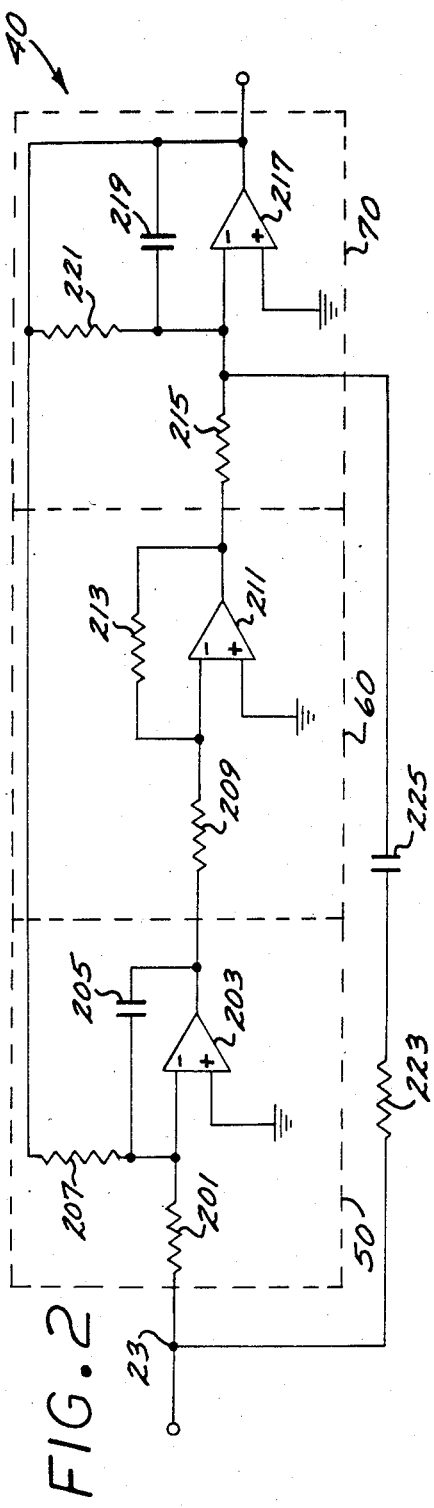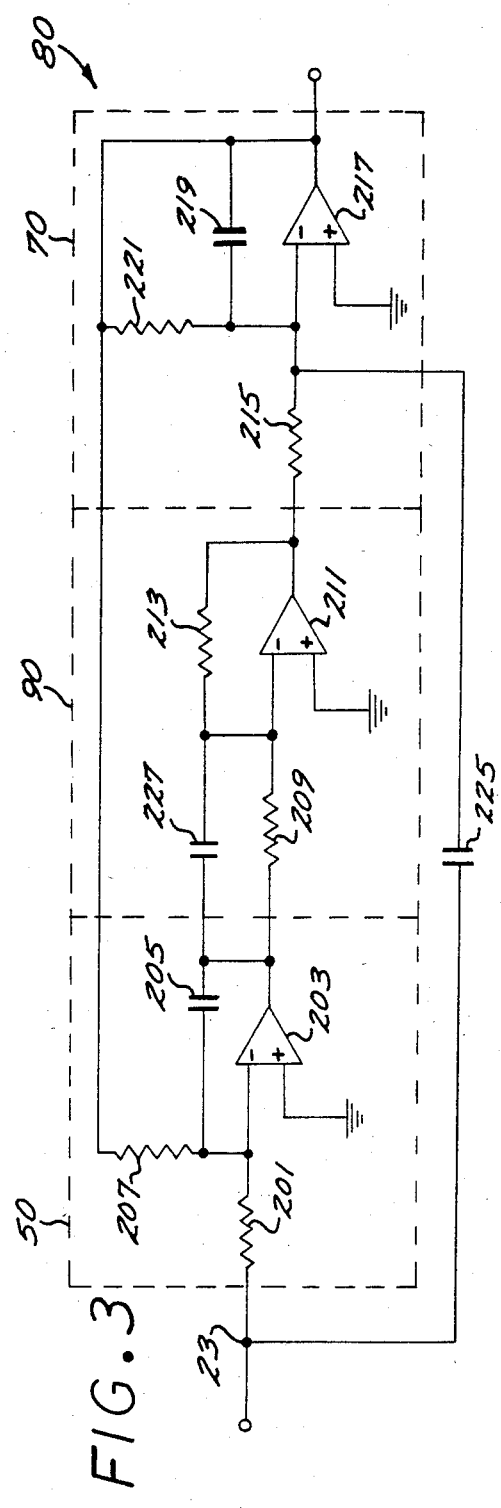
FIG. 2
FIG. 3

OPERATIONAL AMPLIFIER COMPENSATION TECHNIQUE FOR BIQUADRATIC NOTCH ACTIVE FILTERS

BACKGROUND OF THE INVENTION

1. Field of the Invention

The disclosed invention relates to active notch filters, and is particularly directed to a phase compensated active notch filter.

2. Background Art

Notch filters are typically utilized to remove a predetermined frequency or to remove a very small range of frequencies. As is well known, in physical realizations of a notch filter other frequencies on either side of the notch frequency will also be attenuated to varying degrees, such that the response characteristic of a notch filter resembles a notch.

While notch filters have been implemented as passive filters, active filter implementations have become popular as a result of advances in integrated circuit technology. Well-known active filter implementations include the state-variable implementations and the switched capacitor implementations of a second-order notch function. Examples of such implementations are set forth in the article "Improved Circuits for the Realization of Switched-Capacitor Filters," Martin, *IEEE Transactions on Circuits and Systems*, Vol. CAS-27, No. 4, April 1980, pp. 237–244.

Further examples of active biquadratic notch filters are set forth in U.S. Pat. No. 3,868,605, issued to Poole on Feb. 25, 1975; and in U.S. Pat. No. 4,242,642, issued to Laker et al. on Dec. 30, 1980.

Active filter implementation of a biquadratic notch filter typically includes two integrating stages wherein each stage includes an operational amplifier and an associated feedback capacitor. Two signal paths are provided between the input to the active filter and the input to the operational amplifier of the output integrating stage.

The primary signal path includes an input integrating stage and an output stage comprising a lossy integrator. If the input intergrating stage inverts the signal, then an inverting stage is interposed between the input integrating stage and the output integrating stage. The inverting stage may be realized with an operational amplifier or as part of a switched capacitor implementation of a resistive impedance. With ideal operational amplifiers, the feedback capacitor in the input integrating stage would result in 90 degrees of current lag in the primary signal path.

The secondary signal path typically includes a capacitor in parallel with the primary signal path for introducing 90 degrees of current lead. Ideally, at the notch frequency the current signals of the primary and secondary signal paths would be 180 degrees out-of-phase, and, assuming substantially equal amplitudes, would cancel to produce a current null at the input of the operational amplifier of the output integrating stage.

However, actual operational amplifiers are physical devices which do not behave ideally. Particularly, actual operational amplifiers introduce lagging phase shift, which creates an imbalance between the primary and secondary signal paths. As a result, the net current at the input to the output stage operational amplifier at the notch frequency is not zero and the depth of the notch is not infinite. Typically, the depth of the notch may be nominally about 40 db relative to the maximum signal. For some applications, that may be sufficient rejection, but other applications require greater rejection and therefore a deeper notch.

SUMMARY OF THE INVENTION

It would therefore be an advantage to provide an active notch filter which provides substantially increased rejection at the notch frequency.

It would also be an advantage to provide an active notch filter which includes efficient compensation for the phase characteristics of one or more operational amplifiers in the filter.

Another advantage would be to provide an active notch filter which includes compensation to overcome limitations on notch depth resulting from reduced gain-bandwidth products of operational amplifiers in the active notch filter.

Still another advantage would be to provide an active notch filter which provides substantially increased rejection at the notch frequency and which is readily implemented with large scale integration (LSI) techniques that restrict gain and power consumption.

The foregoing and other advantages and features are achieved in the invention which incudes an active biquadratic notch filter having first integrating circuitry including at least one operational amplifier and being responsive to an input signal for providing a first integration signal, and further having second integrating circuitry responsive to the first integration signal for providing a filter output. The notch filter further includes compensation circuitry for compensating the limitation on notch frequency attenuation resulting from current lag introduced by the at least one operational amplifier of the first integrating circuitry.

BRIEF DESCRIPTION OF THE DRAWINGS

The advantages and features of the disclosed invention will readily be appreciated by persons skilled in the art from the following detailed description when read in conjunction with the drawing wherein:

FIG. 2 is a circuit schematic of a continuous implementation of the active notch filter of the invention.

FIG. 3 is a circuit schematic of another continuous implementation of the active notch filter of the invention.

DETAILED DESCRIPTION

Figure 1:
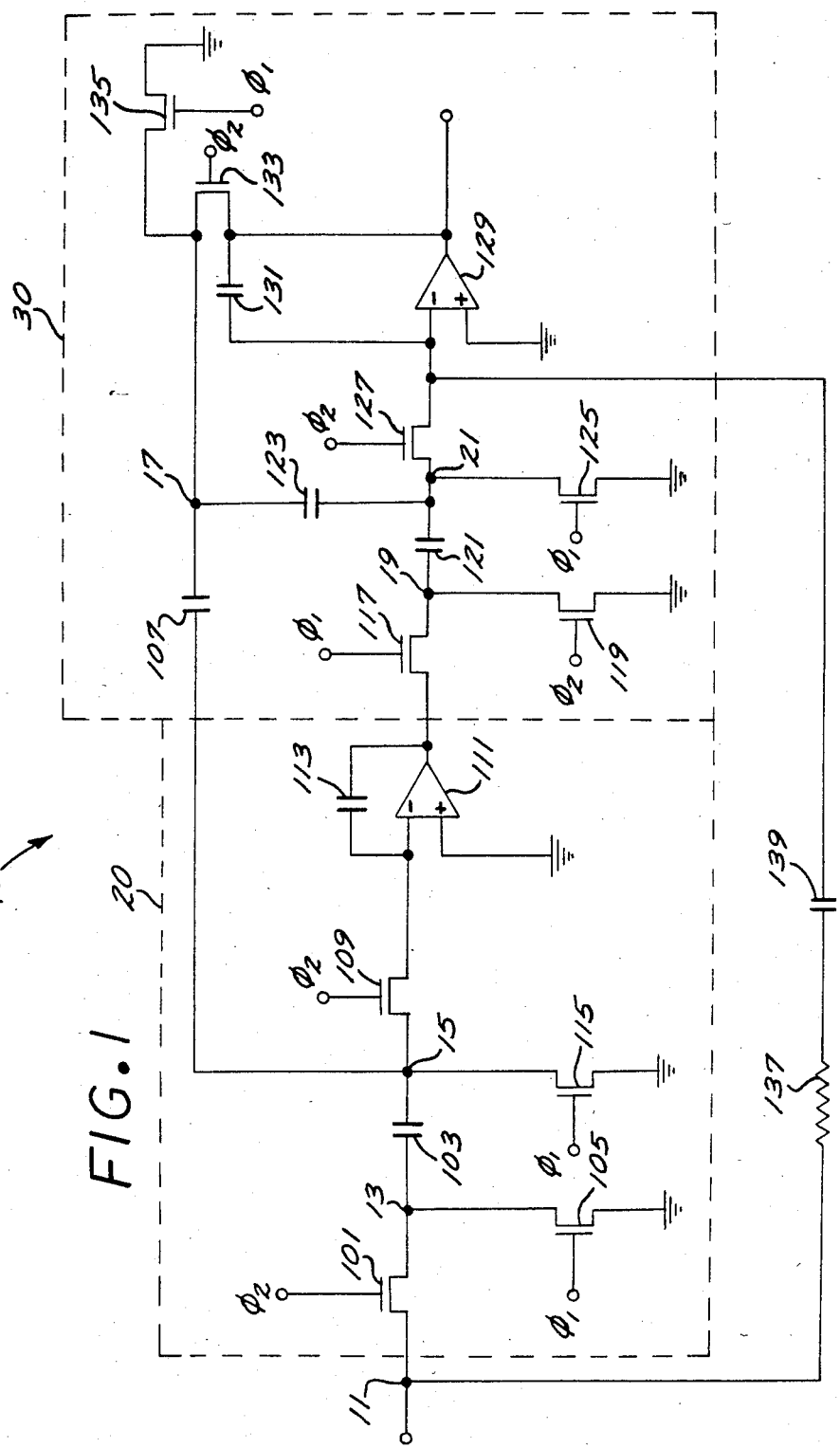
FIG. 1 is a circuit schematic of a switched capacitor implementation of the active notch filter of the invention.

In the following detailed description and in the several figures of the drawing, like elements are identified with like reference numerals.

Also in the following discussion as it relates to switched capacitors, switching is disclosed as being accomplished by n-channel FET devices which are clocked by non-overlapping clocks $\phi1$ and $\phi2$, as is well known in the art. P-channel devices may also be utilized with appropriate clock polarities. As is further well known in the art, the switching of switched capacitors may also be accomplished with transmission gates having both n-channel and p-channel devices.

Referring now to FIG. 1, shown therein is an active biquadratic (biquad) notch filter 10 having an input node 11 which receives the input signal and is coupled via an FET switch 101 to a node 13. A switched capacitor 103 is coupled between the node 13 and a node 15, and an FET switch 105 is coupled between the node 13 and ground. The FET switch 101 is controlled by the $\phi2$ clock while the FET switch 105 is controlled by the $\phi1$ clock.

An FET switch 109 is coupled between the node 15 and the inverting input of an operational amplifier 111 which has its non-inverting input connected to ground. A non-switched feedback capacitor 113 is coupled between the output of the operational amplifier 111 and its inverting input. An FET switch 115 is coupled between the node 15 and ground. The FET switch 115 is controlled by the $\phi1$ clock, and the FET switch 109 is controlled by the $\phi2$ clock.

The foregoing described elements collectively comprise an inverting input integrating stage identified with the reference numeral 20. The integrating stage 20 provides an inverted integrated output of the signal applied to the input node 11. The inverted integrated output is subsequently inverted again as discussed below.

The output of the operational amplifier 111 is coupled via an FET switch 117 to a node 19. The FET switch 117 is controlled by the $\phi1$ clock. Another FET switch 119 is coupled between the node 19 and ground, and is controlled by the $\phi2$ clock. A switched capacitor 121 is connected between the node 19 and the node 21.

A switched capacitor 123 is connected between a node 17 and the node 21 which is coupled via an FET switch 125 to ground. The node 21 is further coupled via an FET switch 127 to the inverting input of an operational amplifier 129 which has its non-inverting input coupled to ground. A non-switched feedback capacitor 131 is connected between the output of the operational amplifier 129 and its inverting input. A switched capacitor 107 is connected between the node 15 and the node 17.

The impedances provided by the switched capacitors 107, 123 and the non-switched capacitor 131 affect other characteristics of the notch filter 10, in particular the location and magnitude of the maximum value of the transfer function of the filter.

An FET switch 133 is connected between the output of the operational amplifier 129 and the feedback node 17 which is selectively coupled to ground via an FET switch 135. The FET switch 135 is controlled by the $\phi1$ clock, and the FET switch 133 is controlled by the $\phi2$ clock.

The circuitry including the FET switch 117 and subsequent elements comprise an integrating stage identified with the reference numeral 30. As will be noted, the switched capacitor 121 is switched so that its two sides are not coupled to ground at the same time. As a result, in addition to providing a resistive impedance, the switched capacitor 121 and the phasing of the FET switches 117, 119, 125, 127 cooperate to invert the output of the inverting integrating stage 20. For reference purposes, the signal path from the input node 11 and through the integrating stage 20 to the inverting input of the operational amplifier 129 is referred to as the primary signal path.

The biquad filter 10 further includes a resistor 137 and a non-switched capacitor 139 which are serially coupled between the input node 11 and the inverting input of the operational amplifier 129. The serially coupled resistor 137 and capacitor 139 form a feed forward signal path between the input node 11 and the inverting input of the operational amplifier 129. Such feed forward path shall also be referred to as the secondary signal path.

As is well known, a switched capacitor may be utilized to provide an apparent resistive impedance to signals having frequencies very much less than the switching frequency $f_s$. The effective resistive impedance is approximately equal to $(f_s C)^{-1}$, where C is the capacitance of the switched capacitor. In the biquad filter 10, the switched capacitors 103, 107, 121, 123 simulate resistive elements.

The biquad notch filter 10 of FIG. 1 differs from known prior art filters in that it includes the resistor 137 in series with the capacitor 139. The use of the resistor 137 results in substantially greater attenuation at the notch frequency. The amount of additional attenuation depends on the relation between the desired notch frequency and the gain-bandwidth product of the operational amplifier 111. An increase in attenuation of at least 20 db has been achieved with the embodiment of FIG. 1.

The substantial increase in attenuation is better appreciated from the following discussion.

Ideally, the current phase difference between the primary and secondary signal paths should be 180 degrees at the notch frequency. While that condition is only approximated in actual implementations, the disclosed invention provides substantially better approximation than known implementations as a result of the resistor 137 in the secondary signal path.

The feedback capacitor 113 in conjunction with an ideal operational amplifier and the voltage inversion provided by the FET switches 117, 119, 125, 127 would introduce 90 degrees of phase lag between the voltage at the input node 11 and the current provided by the primary signal path to the inverting input of the operational amplifier 129. However, the operational amplifier 111 is not ideal and therefore introduces additional phase lag which is affected by the gain-bandwidth product of the operational amplifier 111. For a given input frequency, the additional phase lag introduced by the non-ideal operational amplifier 111 decreases as the gain-bandwidth product increases. Any physical realization of the operational amplifier 111 will introduce a certain amount of current lag since an infinite gain-bandwidth product cannot be achieved. Moreover, with LSI technology, power consumption is a critical consideration which favors reduced operational amplifier gain, which results in greater current lag.

The feed forward capacitor 139 introduces 90 degrees of current lead in the secondary signal path between the input node 11 and the inverting input to operational amplifier 129. The series resistor 137 reduces the lead introduced by the capacitor 139 so that the current lead resulting from the secondary signal path is less than 90 degrees.

Thus, the primary signal path provides a current lag of more than 90 degrees, while the secondary signal path provides a current lead of less than 90 degrees. Since the phase characteristics of the capacitors 113 and 139 provide a 180 degree phase difference, the lead reduction of the series resistor 137 is controlled to be very close to the amount of lag introduced by the operational amplifier 111 so that the phase difference between the currents provided to the non-inverting input of the operational amplifier 129 is close to 180 degrees. Such lead reduction is controlled by the value of the resistor 137. By controlling the value of the resistor 137, the phase difference between the currents provided by the primary and secondary signal paths is brought closer to 180 degrees. As a result, the current at the inverting input to the operational amplifier 129 will more closely approximate a current null, and the attenuation at the notch frequency will be greater.

By way of example, the following Table I sets forth representative capacitance and resistance values for a biquad notch filter 10 having a notch frequency of 15 KHz and a clock frequency for the switched capacitors of 4 MHz.

TABLE I

| Element No. | Value |
|---|---|
| 103 | .680 pf |
| 107 | .260 pf |
| 113 | 16.760 pf |
| 121 | .450 pf |
| 123 | .245 pf |
| 131 | 28.830 pf |
| 137 | 2370 ohms |
| 139 | 32.400 pf |

Although the series resistor 137 is shown as a resistor, it could be implemented with a switched capacitor. For the above example having a 4 MHz clock, the switched capacitor would have a value of 105.5 pf.

Referring now to FIG. 2, shown therein is an active biquad notch filter 40 which is a continuous implementation of the invention. Specifically, the biquad notch filter 40 includes an input node 23 which is coupled via an input resistor 201 to the inverting input of an operational amplifier 203 which has its non-inverting input connected to ground. A feedback capacitor 205 is coupled between the output of the operational amplifier 203 and its inverting input. A feedback resistor 207 is connected between the output of the operational amplifier 217 and the inverting input of the operational amplifier 203.

The foregoing described elements collectively comprise an inverting input integrating stage identified with the reference numeral 50. The integrating stage 50 provides an inverted integration output which is subsequently inverted by an inverting stage 60.

The inverting stage 60 includes an input resistor 209 which is coupled between the output of the operational amplifier 203 and the inverting input of an operational amplifier 211 which has its non-inverting input connected to ground. A feedback resistor 213 is connected between the output of the operational amplifier 211 and its inverting input. Preferably, the resistance values of the resistors 209, 213 are the same so that the inverting stage 60 has a gain of unity with a sign inversion.

While the integrating stage 50 and the inverter 60 have been described and identified separately, they can be considered collectively as a non-inverting integrator. The inverter 60 functions solely to invert the output of the integrating stage 50.

The output of the operational amplifier 211 is coupled via a resistor 215 to the inverting input of an operational amplifier 217 which has its non-inverting input coupled to ground. A feedback capacitor 219 and a feedback resistor 221 are coupled in parallel between the output of the operational amplifier 217 and its inverting input. The circuitry including the resistor 215 and subsequent elements comprise an integrating stage identified with the reference numeral 70. The output of the operational amplifier 217 is the output of the biquad notch filter 40.

The biquad filter 40 further includes a resistor 223 and a capacitor 225 which are serially coupled between the input node 23 and the inverting input of the operational amplifier 217.

A comparison of the biquad notch filter 40 of FIG. 2 with the biquad filter 10 of FIG. 1 reveals that the biquad filter 40 of the FIG. 2 is a continuous implementation of the switched capacitor implementation of FIG. 1. Specifically, the resistor 201 corresponds to the switched capacitor 103, and the resistor 207 corresponds to the switched capacitor 107. The inverting stage 60 and the series resistor 215 functionally correspond to the switched capacitor 121 which in addition to simulating a resistor also accomplishes an inversion function.

In the biquad notch filter 40, the primary signal path between the input node 23 and the inverting input of the operational amplifier 217 includes the integrating stage 50, the inverting stage 60, and the resistor 215. The secondary signal path includes the resistor 223 and the feed forward capacitor 225. As between the primary and secondary signal paths, the phase characteristics of the feedback capacitor 205 and the feed forward capacitor 225 provide a 180 degree phase difference. The resistor 223 reduces the lead introduced by the feed forward capacitor 225 in order to offset the lag introduced by the operational amplifiers 203 and 211. By controlling the value of the resistor 223, the current phase difference between the primary and secondary signal paths between the input node 23 and the input to the operational amplifier 217 is brought closer to 180 degrees. As discussed relative to the biquad filter 10 of FIG. 1, the series resistor 223 can be realized with a switched capacitor implementation.

Referring now to FIG. 3, shown therein is a biquad notch filter 80 which is a further continuous implementation of the invention. The biquad filter 80 of FIG. 3 is very similar to the biquad filter 40 of FIG. 2. Specifically, the notch filter 80 does not include the series resistor 223 in the feed forward path, but does include in an inverting stage 90 an additional capacitor 227 in parallel with the resistor 209. Thus, the secondary path comprises solely the capacitor 225 which introduces 90 degrees of current lead. The parallel capacitor 227 in the primary signal path introduces a certain amount of current lead to compensate for the lag introduced by the operational amplifiers 203 and 211.

The foregoing has been a description of an active biquadratic notch filter which overcomes limitations on notch depth imposed by physical realizations of operational amplifiers and provides substantially increased rejection at the notch frequency. Further, the disclosed biquad notch filter is readily implemented with LSI techniques.

Although the foregoing has been a description and illustration of specific embodiments of the invention, various modifications and changes thereto can be made by persons skilled in the art without departing from the scope and spirit of the invention as defined by the following claims.

What is claimed is:

1. An active notch filter comprising:
   first integrating means including at least one operational amplifier responsive to an input signal for integrating the input signal to provide a first integration signal;
   second integrating means responsive to said first integration signal for providing a filter output; and
   feed forward means in parallel with said first integrating means for providing a current signal for tending to cancel the current signal of said first integration signal, said feed forward means including means for compensating the effects of current lag introduced by said at least one operational amplifier of said first integrating means, whereby said compensating means substantially increases the attenutation of the active notch filter at the notch frequency.

2. The active notch filter of claim 1 wherein said feed forward means includes a capacitor and wherein said compensating means includes means for providing a resistive impedance in series with said capacitor.

3. The active notch filter of claim 2 wherein said means for providing a resistive impedance comprises a resistor.

4. The active notch filter of claim 2 wherein said means for providing a resistive impedance comprises a switched capacitor.

5. An active notch filter comprising:
integrating means including an operational amplifier responsive to an input signal for providing an inverted integration output;
inverter means including an operational amplifier responsive to said inverted integration output for providing a non-inverted integration output;
feed forward means in parallel with said integrating means for providing a current signal for tending to cancel the current signal of said non-inverted integration output; and
compensating means for compensating the effects of the current lag introduced by said operational amplifiers of said integrating means and said inverting means, whereby said compensating means substantially increases the attenuation of the active notch filter at the notch frequency.

6. The active notch filter of claim 5 wherein said compensating means comprises a capacitor coupled between said integrating means and said inverter means.

7. The active notch filter of claim 5 wherein said compensating means comprises a resistor in series with said feed forward means.

8. The active notch filter of claim 5 wherein said compensating means comprises a switched capacitor in series with said feed forward means.

9. An active notch filter comprising:
first integrating means including an operational amplifier responsive to an input signal for integrating the input signal to provide an inverted integration signal;
inverter means including an operational amplifier responsive to said inverted integration signal for providing a non-inverted integration signal;
second integrating means responsive to said non-inverted integration signal for providing a filter output; and
feed forward means in parallel with said first integrating means for providing a current signal for tending to cancel the current signal of said first integration signal, said feed forward means including means for compensating the effects of current lag introduced by said operational amplifiers of said first integrating means and said inverter means, whereby said compensating means substantially increases the attenutation of the active notch filter at the notch frequency.

10. The active notch filter of claim 9 wherein said feed forward means includes a capacitor and wherein said compensating means includes means for providing a resistive impedance in series with said capacitor.

11. The active notch filter of claim 10 wherein said means for providing a resistive impedance comprises a resistor.

12. The active notch filter of claim 10 wherein said means for providing a resistive impedance comprises a switched capacitor.

* * * * *